United States Patent [19]

Howell et al.

[11] Patent Number: 5,969,894

[45] Date of Patent: Oct. 19, 1999

[54] METHOD FOR DETECTING DATA ENCODED AS STATE TRANSITIONS IN A READ SIGNAL

[75] Inventors: Jones V. Howell, Newport Beach; Leroy J. Thompson, Mission Viejo; Gregory A. Unruh, San Clemente, all of Calif.

[73] Assignee: Seagate Technology, Inc., Scotts Valley, Calif.

[21] Appl. No.: 09/219,309

[22] Filed: Dec. 23, 1998

Related U.S. Application Data

[62] Division of application No. 08/525,232, Sep. 8, 1995, Pat. No. 5,892,631.

[51] Int. Cl.[6] .................................................. G11B 5/09
[52] U.S. Cl. .............................................. 360/51; 360/46
[58] Field of Search .................................... 360/46, 51

[56] References Cited

U.S. PATENT DOCUMENTS

| | | |
|---|---|---|
| 3,671,935 | 6/1972 | Lipp et al. .................... 340/146.1 AB |
| 4,007,458 | 2/1977 | Hollabaugh ........................ 340/310 R |
| 4,258,394 | 3/1981 | Kennedy .................................. 358/284 |
| 4,580,278 | 4/1986 | Yamamoto ............................. 375/106 |
| 4,633,386 | 12/1986 | Terepin .................................... 364/200 |
| 4,855,983 | 8/1989 | Arai ............................................ 369/46 |
| 5,003,562 | 3/1991 | van Driest et al. ..................... 375/119 |
| 5,197,086 | 3/1993 | Jackson et al. ........................ 375/119 |
| 5,400,367 | 3/1995 | Meylemans et al. ................... 375/106 |

*Primary Examiner*—W. Chris Kim
*Attorney, Agent, or Firm*—McDermott, Will & Emery

[57] ABSTRACT

A data detection circuit for a read channel that recovers data encoded as the presence or absence of flux transitions on a magnetic recording medium, compares a current data sample of a read signal with a previous data sample and a threshold to determine whether the previous data sample represents a flux transition. The use of two data samples in the determination of flux transitions provides a more accurate detection of the data than comparing a single data sample to a threshold value. The data detection circuit generates an output data signal having data values based on the determined flux transitions of the data samples.

4 Claims, 8 Drawing Sheets

| INPUTS | | | | | OUTPUTS | | | | COMMENTS |
|---|---|---|---|---|---|---|---|---|---|
| LS | X2>X1+THR | X2<X1 | X2<X1-THR | X2>X1 | LD_UP | LD_DN | EN_X1 | NEXT_LS | |
| 0 | X | X | 0 | 0 | 0 | 0 | 0 | 0 | No Decision, Test Next Bit |
| 0 | X | X | 0 | 1 | 1 | 0 | 1 | 0 | X2 More Likely than X1 |
| 0 | X | X | 1 | 0 | 0 | 1 | 1 | 1 | X2 is Possible Neg Pulse, Output most likely Pos. Pulse (X1) |
| 0 | X | X | 1 | 1 | X | X | X | X | Invalid |
| 1 | 0 | 0 | X | X | 0 | 0 | 0 | 1 | No Decision, Test Next Bit |
| 1 | 0 | 1 | X | X | 0 | 1 | 1 | 1 | X2 More Likely than X1 |
| 1 | 1 | 0 | X | X | 1 | 0 | 1 | 0 | X2 is Possible Pos Pulse, Output most likely Neg Pulse (X1) |
| 1 | 1 | 1 | X | X | X | X | X | X | Invalid |

Figure 6

METHOD FOR DETECTING DATA ENCODED AS STATE TRANSITIONS IN A READ SIGNAL

This application is a divisional of application Ser. No. 08/525,232 filed Sep. 8, 1995 U.S. Pat. No. 5,892,631.

TECHNICAL FIELD OF THE INVENTION

The present invention relates to the field of recovering data in magnetic recording, and more particularly, to the accurate detection of transitions in the flux levels recorded on a magnetic recording medium, the presence or absence of flux transitions representing different logic level values of data recorded on the magnetic recording medium.

DESCRIPTION OF THE RELATED ART

In typical Systems for magnetically recording digital data, logical level ones (1's) are recorded as flux transitions and zeroes (0's) are recorded as an absence of flux transitions. The possible flux levels on the media may be represented, for example, by the lattice structure of FIG. 1.

If the read electronics are in lattice state 0 (negative flux level), a positive flux transition at time 1 infers a change to lattice state 1. No flux transition at time 1 infers that the lattice remains in state 0. A negative flux transition cannot produce any change of state, and is disregarded.

Similarly, if the read electronics are in lattice state 1 (positive flux level), a negative flux transition at time 1 infers a change to lattice state 0. No flux transition at time 1 infers that the lattice remains in state 1. A positive flux transition cannot produce any change of state, and is likewise disregarded.

The standard method of detecting a positive flux transition, while in lattice state 0, is by determining if a positive peak occurred within a timing window T and that the positive peak was greater than a specified threshold Vt. Similarly, the standard method of detecting a negative flux transition, while in lattice state 1, is by determining if a negative peak occurred within a timing window T, and that the negative peak was less than a specified threshold Vt.

A simplified model of the standard detection method determines if the amplitude is greater or less than a specified threshold Vt at the center of the bit cell. Each amplitude sample is the sum of the ideal signal (s) plus noise (n), i.e.:

if LS=0 and s+n>=+Vt, Positive Flux Transition (to LS=1) detected.

if LS=0 and s+n<+Vt, No Flux Transition.

and if LS=1 and s+n<=-Vt, Negative Flux Transition (to LS=0) detected.

if LS=1 and s+n>-Vt, No Flux Transition.

If the zero-to-peak amplitude of the ideal signal (s) is defined to be S, then the ideal signal s may have values of +S, 0, and -S. If Vt=k*S, then the probability of detecting a one as a zero (1err) and a zero as a one (0err) may be described by:

if LS=0, Prob(0err)=Prob(n>=k*S)

if LS=0, Prob(1err)=Prob(s+n<k*S)=Prob(n<-(1-k)*S)

and if LS=1, Prob(0err)=Prob(n<=-k*S)

if LS=1, Prob(1err)=Prob(s+n>-k*S)=Prob(n>(1-k)*S)

If it is assumed that k=½, then:

Prob(err)=Prob(|n|>=½*S)

For gaussian noise, the 1-sigma amplitude of the noise samples (n) is N. The signal to noise ratio is snr. Dividing both sides by N:

snr=S/N

N=S/snr

Dividing both sides of the inequality in the Probability equation by N leads to:

Prob(err)=Prob (|n/N|>½*snr)    Eqn. (1)

For this normalized gaussian process, the probability function may be expressed by the equation below.

$$\text{Prob}(x) \equiv (2 \cdot \pi)^{-.5} \cdot \int_{x}^{\infty} e^{-\left[\frac{1}{2}\right] \cdot t^2} dt$$

Curve 24 plotted on the graph of FIG. 2 depicts the relationship between snr (displayed in dB), and the probability of a bit error (displayed as Bit Error Rate (BER)=1/Prob(err)) for this single-bit process of detecting data.

FIG. 3 is a block diagram of a typical read channel that recovers data with the probability of a bit error in accordance with the above discussion. Following a pickup device, such as an inductive or magneto-resistive read head for magnetic recording, the signal ($V_{head}$) is amplified to a usable level, and filtered to provide the desired phase and frequency characteristics of the flux transition pulses, by a filter/amplifier 10. A variable gain amplifier 12, controlled by feedback from a peak amplitude detector 14 and comparator 16, comprises an automatic gain control (AGC) system used to compensate for variations in signal output and produces a read signal ($V_{read}$).

A pulse detector 17 receives the read signal $V_{read}$ and generates a digital read pulse (RDP) signal, indicating the time at which peaks in the read signal $V_{read}$ occurred. The output from the peak amplitude detector 14 also forms an input to the pulse detector 16 so that RDP pulses are only generated for peaks above the threshold, as described previously.

A voltage controlled oscillator (VCO) 20 generates a clock signal (RCLK) used to decode the RDP pulses. The RCLK signal is fed into a phase/frequency comparator 18 to provide a control voltage ($V_{VCO}$), in order to speed up and slow down the VCO 20 to match the average frequency of the flux transitions. The VCO 20 and the phase/frequency comparator 18 together comprise a phase locked loop (PLL).

In the standard pulse data detecting read channel of FIG. 3, the RCLK and RDP signals are provided as inputs to a data separator 22. Whenever an RDP pulse occurs between RCLK cycles, a one (1) bit is output on the output data signal (RDATA). When no RDP pulses occur between RCLK cycles, a zero (0) bit is output. It should be remembered that the output data signal RDATA is a one for flux transitions, and not when the flux state is equal to 1.

In the standard read channel of FIG. 3, noise produced in the read head, or induced in the read electronics, causes some of the bits to be improperly detected, resulting in a data error. Error correction schemes remove many of these errors, but the higher the bit error rate, the higher the probability of an uncorrectable error.

There is a need for a read channel with improved data detection that reduces the bit error rate in comparison to read channels of the prior art.

SUMMARY OF THE INVENTION

This and other needs are met by the present invention which provides a data detection circuit for detecting data recovered as a read signal from a magnetic recording medium. The data detection circuit samples the read signal to produce data samples, each data sample having one of two states. The data detection circuit comprises a data sample holder that receives and holds a data sample, and logic circuitry coupled to the data sample holder. The logic circuitry compares a first data sample held by the data sample holder with a second data sample. Based on this comparison, the logic circuitry determines, as a function of the first and second data samples, whether the state of one of the data samples represents a state transition from the state of a previous data sample and generates an output data signal with data values indicative of the determined state transitions for each data sample.

The earlier stated needs are also met by another aspect of the present invention which provides a read channel for recovering data from a magnetic recording medium on which data values of digital data are recorded as the presence or absence of flux transitions on the magnetic recording medium. The read channel has a pulse detector that produces a read pulse signal from a read signal, and a phase locked loop that produces a read clock signal from the read pulse signal. The read channel also has a data detection circuit that samples the read signal to produce data samples and compares a current data sample with a previous data sample to determine whether the previous data sample represents a flux transition. The data detection circuit generates an output data signal having data values corresponding to the determined flux transitions of the data samples.

In certain embodiments of the present invention, the data detection circuit, clocked by the read clock, operates on a read signal that has not yet passed through the pulse detector. However, the read clock generated by the phase locked loop is referenced to the output of the pulse detector and not to the read signal. A variable delay is therefore needed to delay the output of the pulse detector so that the read clock will clock the data detection circuit to sample the read signal at the center of each bit cell. Another aspect of the present invention, therefore, provides a method of calibrating a variable delay in a read channel having a peak-to-peak amplitude detector that detects the amplitude of a read signal recovered from a recording medium, and a phase locked loop that generates a read clock signal from the read signal. The method comprises the steps of inverting the read clock signal, and passing a fixed data pattern through the read channel and synchronizing the phase locked loop to the fixed data pattern. An output of the amplitude detector is monitored. The variable delay is adjusted so that the amplitude detector detects a minimum amplitude of the read signal. The inverted read clock signal is reinverted such that the amplitude detector detects a maximum amplitude of the read signal.

The inversion of the read clock signal for calibration of the variable delay overcomes the problems of accuracy in finding the ideal delay caused by the relative flatness at the peak amplitudes in the curve of delay vs. amplitude. The flatness at the peak amplitude makes it difficult to precisely locate the peak amplitude of the read signal, and therefore, the ideal delay. The minimum amplitude regions of the delay vs. amplitude curve, however, are much sharper, so that a minimum amplitude may be much more precisely located. Once the delay is adjusted for the minimum amplitude, simply re-inverting the read clock signal causes the resulting amplitude measurements to be precisely at the peaks of the read signal.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 6 is an exemplary truth table of the decoder logic for the decoder of the data detection circuit of FIG. 5.

DETAILED DESCRIPTION OF ILLUSTRATIVE EMBODIMENTS

Figure 3:
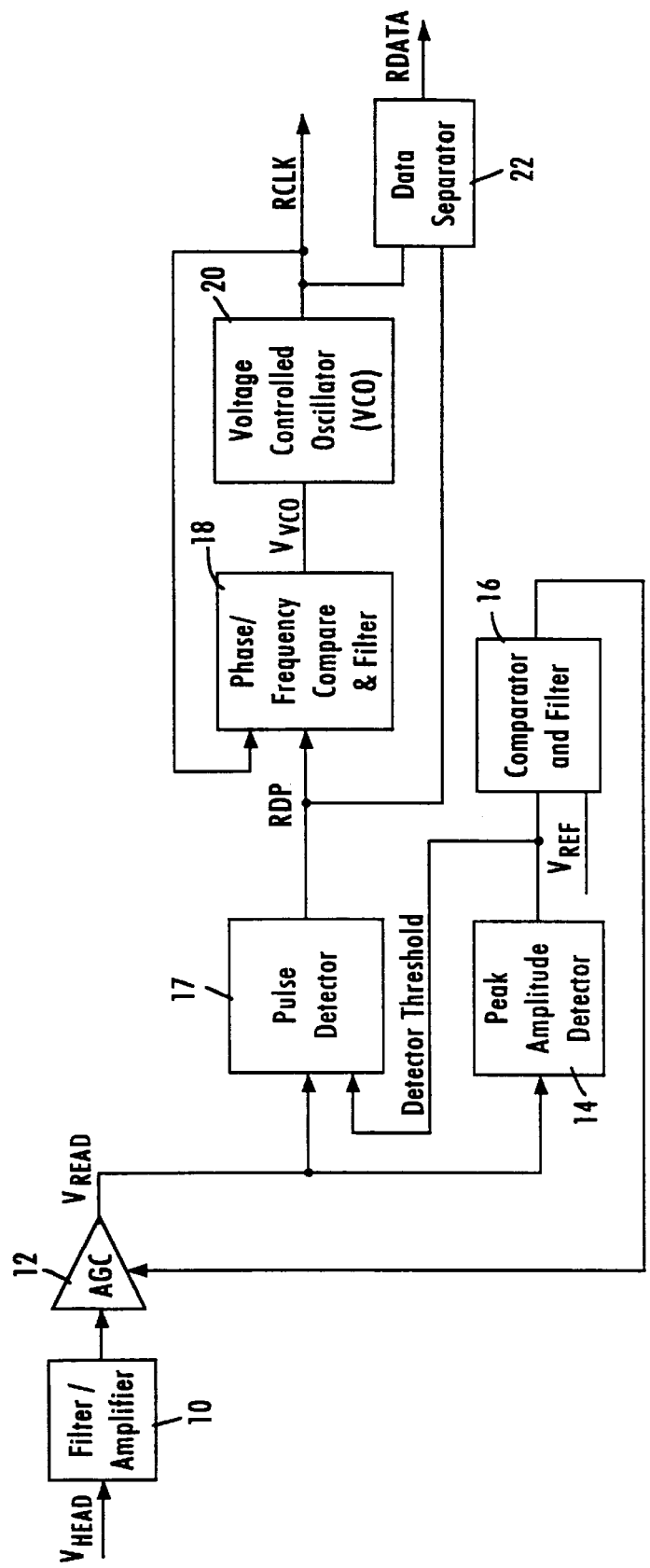
FIG. 3 is a block diagram of a read channel constructed in accordance with the prior art.
Figure 4:
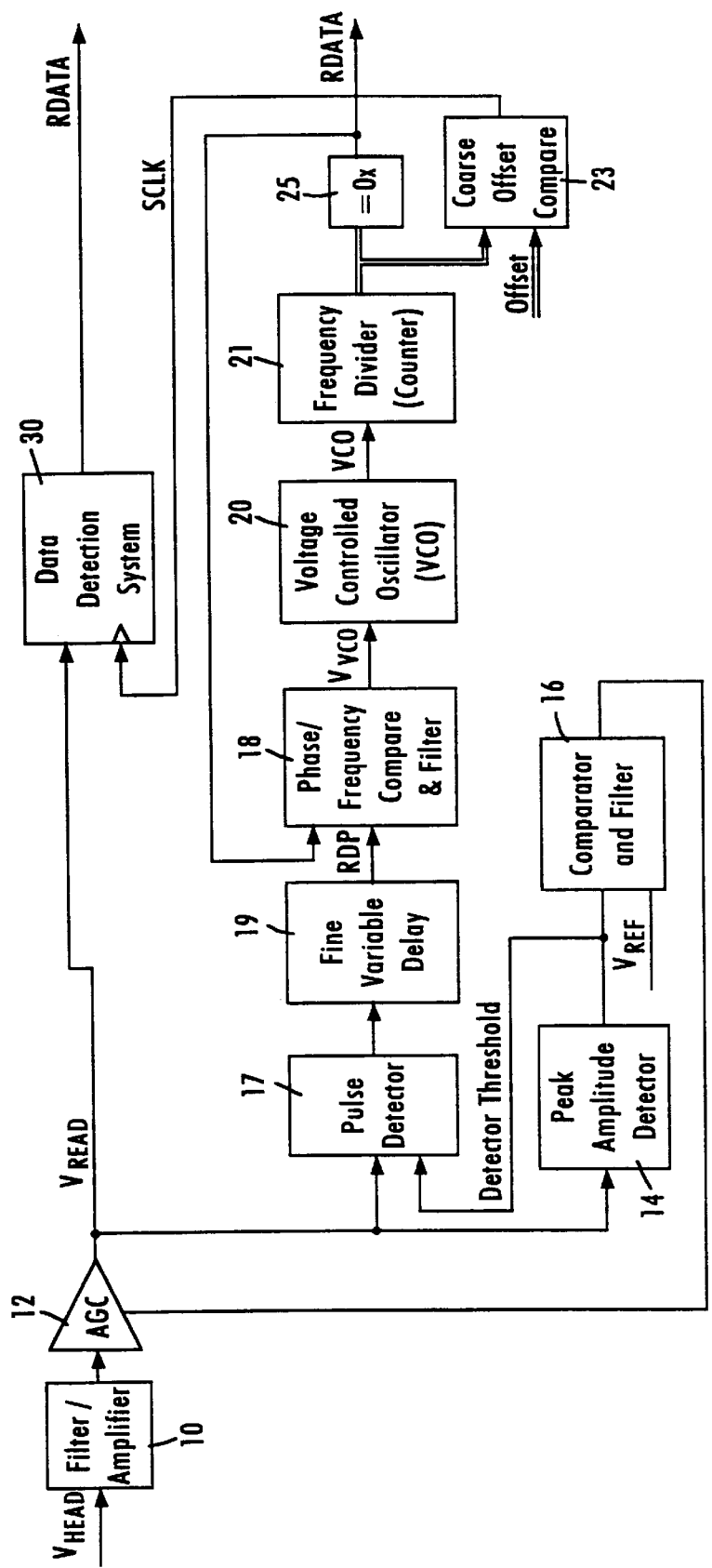
FIG. 4 is a block diagram of a read channel constructed in accordance with an embodiment of the present invention.

An embodiment of the read channel of the present invention, which provides an improved bit error rate by basing its data detection on multiple events, rather than a single event, is depicted in the block diagram of FIG. 4. The read channel of the present invention has many of the same components as the standard read channel of the prior art depicted in FIG. 3. These common components therefore retain the same reference numerals in FIG. 4 as provided in FIG. 3, and perform the same function as in the standard read channel, unless otherwise noted in the following description.

In the read channel of FIG. 4, a variable delay circuit 19 is coupled between the pulse detector 17 and the phase/frequency comparator 18. Since the pulse detector 17 produces pulses which are somewhat delayed from the actual peaks of the read signal, the variable delay allows the PLL 18, 20 to generate clocks which can sample the read signal in the center of each bit cell. The operation of the frequency divider (counter) 21 and coarse offset comparator 23 will be described later. An embodiment of a method for calibrating this variable delay will also be described later.

The read channel of the present invention replaces the data separator 22 of FIG. 3 with a data detection circuit 30, which uses the SCLK signal to take samples of the read signal at the center of each bit cell, determine when flux transitions have occurred, and output these as the output data signal RDATA.

Figure 5:
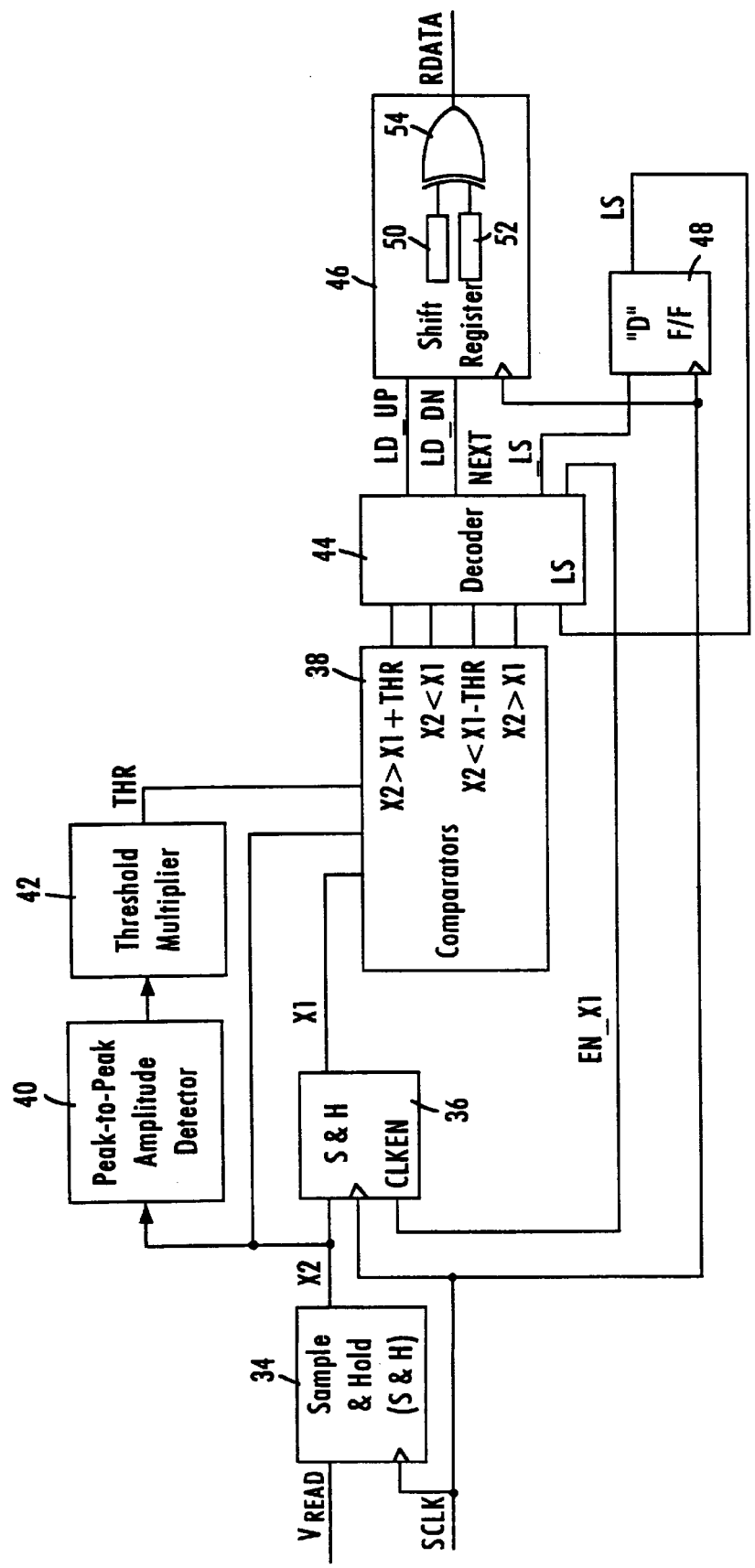
FIG. 5 is a block diagram of a data detection circuit used in the read channel of FIG. 4, constructed in accordance with an embodiment of the present invention.

FIG. 5 is a block diagram depicting in more detail an embodiment of the data detection circuit 30 in the read channel of FIG. 4. This embodiment is exemplary only, as the functions may be implemented in analog logic, discrete digital logic, or digital signal processor (DSP) software.

A first sample and hold circuit 34 samples the read signal $V_{read}$ at the center of each bit cell, as determined by the edges of the SCLK signal. The output X2 contains the amplitude of the most recent sample, referred to as s1+n1 in the previous discussion. A second sample and hold circuit 36 holds some previous sample, X1, to which X2 will be compared. The second sample and hold circuit 36 is only updated when the update signal (EN_X1) is active, indicating that a determination has been made.

A peak-to-peak amplitude detector 40 and threshold multiplier 42 generate a threshold signal THR, which is used in the comparison of data samples X1 and X2. The comparison is made by comparator logic 38, which performs the comparisons defined in equations 2 through 5, described earlier. The results of the comparison by the comparator logic 38 are provided as comparison result signals to decoder logic 44.

The decoder logic 44 decodes the comparison result signals and an LS bit, to determine when positive and negative flux transitions have occurred. FIG. 6 is a truth table which defines the actions of the decoder logic 44 for every set of signal inputs. A NEXT_LS output signal is generated by the decoder logic 44 and provided to the input of a flip/flop 48, which generates the value for LS in the next comparison cycle.

The decoder logic 44 also produces decoder LD_UP and LD_DN signals that form shift register control signal inputs to a dual shift register 46. A dual shift register 46 is an efficient means of keeping track of the number of bits that have passed since the last decision, and applying the results of a decision to many bits at once.

If the LD_UP and LD_DN signals are both false, then a '1' is shifted into the first bit of an upper shift register 50, a '0' is shifted into the first bit of a lower shift register 52, and all of the other bits are shifted one place. Whenever the LD_UP bit is true, the values of all the lower shift register bits are shifted one bit, and loaded into the lower and upper shift registers 50, 52 simultaneously. Likewise, when the LD_DN signal is true, the values of all the upper shift register bits are shifted one bit, and loaded into the upper and lower shift registers 50, 52.

The combination of a '1' and a '0' at any bit position of the upper and lower shift registers 50, 52 indicates that the flux state for that bit (corresponding to a data sample) has not yet been determined. When a LD_UP occurs in this condition, both bits become a '0' (and are shifted one place) in the next cycle, indicating that the lattice state is a '0' for that bit. When a LD_DN occurs in this condition, both bits become a '1' (and are shifted one place) in the next cycle, indicating that the lattice state is a '1' for that bit. Once both upper and lower bits are either '0' or '1', the LD_UP and LD_DN signals cannot cause any more changes, so the lattice state for that bit simply continues to shift every clock cycle.

An exclusive-OR (XOR) gate 54 in the dual shift register 46 has inputs coupled to the end of the shift registers 50, 52. The XOR gate 54 generates a data value of '1' on the RDATA signal whenever a transition in the flux state is shifted out of the last bits of the shift registers 50, 52, and a '0' otherwise. In preferred embodiments, the dual shift register 46 is at least as long as the maximum distance between positive and negative pulses for the encoding format used. For RLL(1,7) code, for example, transitions may be eight bit cells apart, requiring a shift register 8 bits long.

Figure 7:
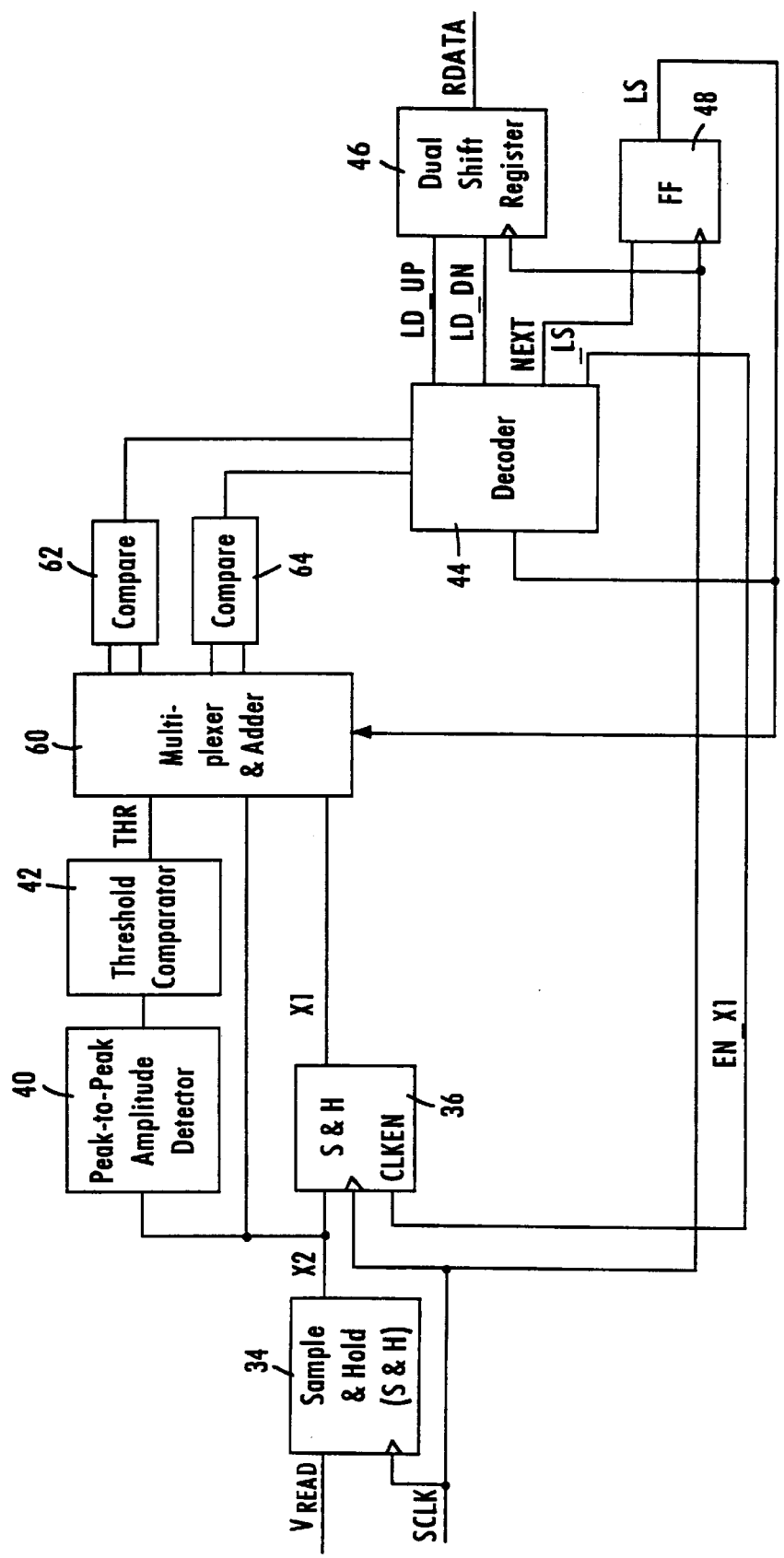
FIG. 7 is a block diagram of a data detection circuit used in the read channel of FIG. 4, constructed in accordance with another embodiment of the present invention.

From the truth table of FIG. 6, it is apparent that only two of the comparison result signals are used by the decoder logic 44 for any bit cell, as determined by the value of the LS signal. Another embodiment of a data detection circuit according to the present invention, depicted in FIG. 7, takes advantage of this by using the LS bit to multiplex the inputs to two comparators 62, 64, which significantly reduces the logic in a digital implementation. The specific mapping of the multiplexer and adder functions 60 are not shown as there are a number of ways to implement the same functionality.

Figure 8:
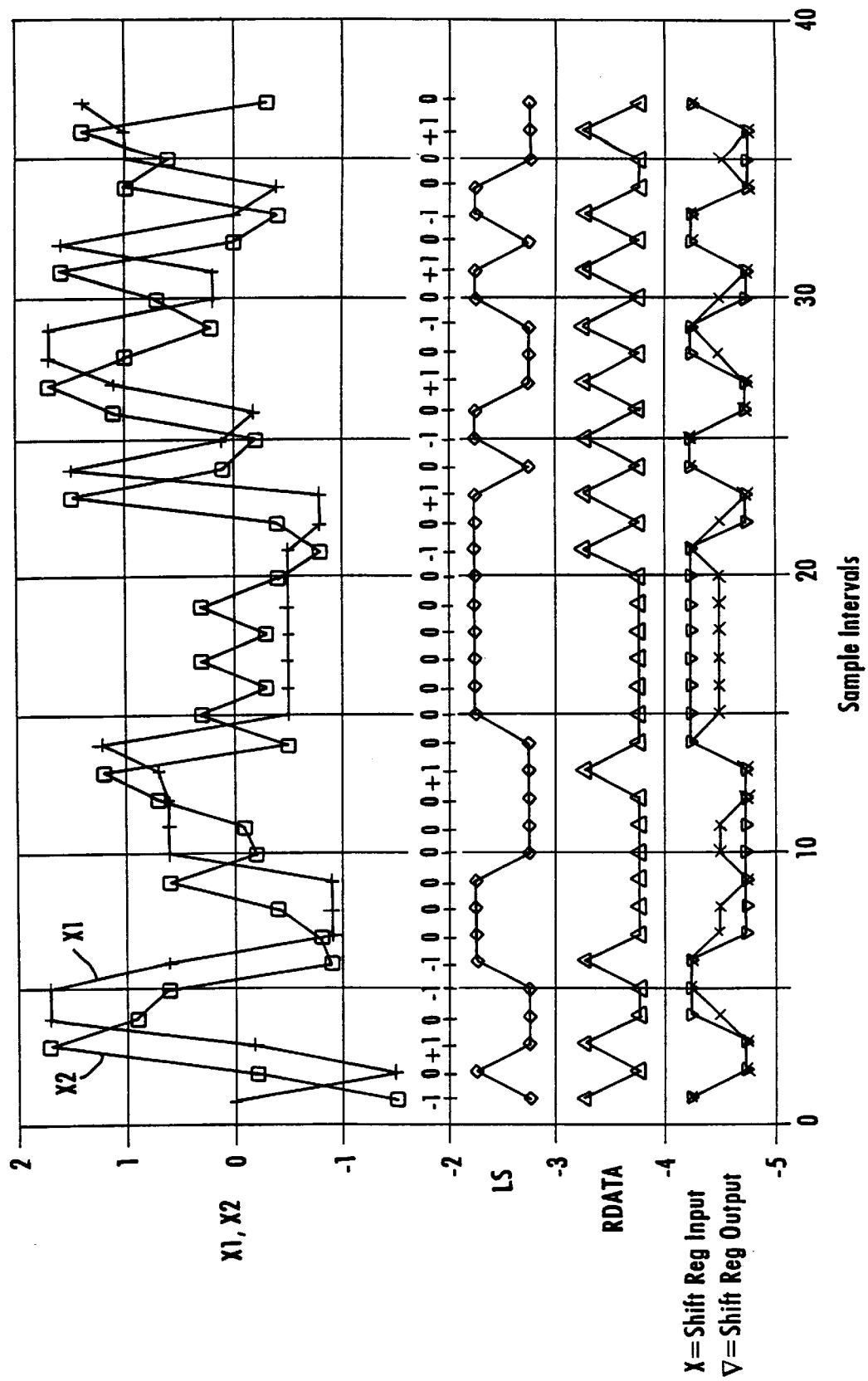
FIG. 8 is an exemplary timing diagram of the signals related to the data detection circuit of FIGS. 5 or 7.

FIG. 8 is a timing diagram of the data detection circuit of the present invention in operation for a short set of exemplary read signal samples. Since the sample and hold circuits 34, 36 and all of the digital logic are only updated on RCLK edges, all values are actually held for an entire clock period. For readability, however, these values are displayed as points at the sample time, connected by straight lines.

The X2 waveform represents signal + noise for a current data sample, sampled at the center of each data bit cell. The numerical indications below this line indicate the "ideal" amplitudes that would be measured if there were no noise. The X1 waveform shows the amplitude of the data sample that is being compared to the current data sample to make a decision.

The LS waveform provides an indication whether the data detection circuit 30 is searching for X2−X1>THR (LS=0) or X2−X1<−THR (LS=1). The RDATA waveform is actually shifted in time so that output pulses align with input flux transitions for clarity.

The bottom curves in FIG. 8 represent the values in the dual shift register 46. As with RDATA, the values in FIG. 8 are shifted in time to match up to the corresponding flux transitions. The "X" symbols are trinary values which represent positive, unknown, or negative flux states, put into the shift register, as high, middle, and low, respectively. The triangle markers represent the same three states at the shift register output.

By examining this timing diagram, the effectiveness of the data detection circuit 30 of the present invention becomes apparent. The value of the current data sample X2 at step 9 represents a noise pulse which would be detected as a data pulse in a standard data detector. In the data detection circuit of the present invention, however, this bit is used to confirm that the previous X1 data sample actually was a negative flux transition. The current data sample X2 is then moved to X1 in the second sample and hold circuit 36 to compare against following samples.

At steps 10 and 11, none of the comparator conditions are met, so X1 is not updated, and the state of these bits is not immediately known. At step 12, a more positive data sample is found, so this value is moved to X1, and the not yet determined bits in the shift register are set to '0'. At step 13, an even more positive value is found, so the process is repeated. Finally, at step 14, a sample which is less than X1−Vt is found, which validates that the data sample in bit cell 13 was in fact a positive flux transition.

A unique advantage of the data detection circuit 30 of the present invention is its ability to read through sections which have large DC offsets. The sample at step 29 is correctly identified as a negative flux transition, even though the amplitude remains positive. Conventional pulse data detectors are unable to read this pattern no matter how low their threshold voltages were set.

Theoretically, the ideal threshold THR should be ½ of the peak-to-peak amplitude. Because of dropouts encountered in magnetic recording, which have amplitude drops faster than the AGC 12 can completely correct for, the best threshold to use can be empirically determined under a specific set of conditions. A programmable threshold multiplier can be adapted to find the setting required for the lowest error rate.

Returning to FIG. 4, the frequency divider 21 allows the VCO output to be at a higher frequency than the RCLK signal. The frequency divider is a programmable binary counter in preferred embodiments. The "=0?" circuit 25 generates an RCLK output every time the counter reaches 0. This signal is also used to re-load the counter with its programmed count rate. The coarse offset comparator 23 generates a sample clock SCLK when the counter matches a selectable value.

As previously described, the read data pulse (RDP) signals generated by the pulse detector 17 are somewhat delayed from the peaks (nominal bit cell centers) of the read signal $V_{read}$. In a standard pulse detection circuit, this is not a problem since the read clock (RCLK) is referenced to the RDP and not the read signal $V_{read}$. Even if a faster pulse detector is used, the sample and hold circuit may have an undesirable sampling delay that needs to be canceled out. In order to sample the read signal $V_{read}$ at the center of the nominal bit cell, the present invention performs both a coarse adjustment and a fine adjustment of the read clock RCLK to form a sampling clock SCLK. The coarse delay is provided by a coarse offset comparator 23. If the frequency counter is programmed to divide by 8, for example, the coarse offset can generate an SCLK signal which is 0, 45, 90, 135, 225, 270, or 315 degrees after the RCLK signal (12.5% delay steps). This means that the fine variable delay only needs to provide a range of 0 to 45 degrees (0 to 12.5%) in order for any total delay to be generated. This added coarse and fine variable delay adds to and compensates for the delays created by the pulse detector 17 so that the RDP pulses are an integer multiple (preferably 1) of clock periods from the peaks of the read signal $V_{read}$, thus causing the samples to be taken in the center of each bit cell.

The read pulse RDP is generated from the analog signal $V_{read}$ by the pulse detector 17 such that the leading edge of the read pulse signal RDP is phase coherent with the peaks in the waveform of the read signal $V_{read}$. Conventional peak detection channels use this leading edge to synchronize the PLL 18, 20 to generate a read clock (RCLK) used in its data decoder. By contrast, the present invention uses the trailing edge of the read pulse signal RDP to synchronize the PLL 18, 20 to generate RCLK.

The fine adjustment of the phase delay between the peaks of the analog read signal $V_{read}$ and the digital SCLK as generated by the PLL 18, 20 is performed by adjusting the pulse width of the read pulse RDP using the variable delay 19 coupled to the output of the pulse detector 17. The pulse width is adjusted in fine increments under microprocessor control, for example, thereby providing fine adjustment of the phase delay.

The variable delay 19 is formed by a monostable multi-vibrator in a preferred embodiment. As one of ordinary skill in the art will appreciate, in other embodiments, however, the variable delay 19 may be formed by a tap delay line, or by a shift register.

Figure 9:
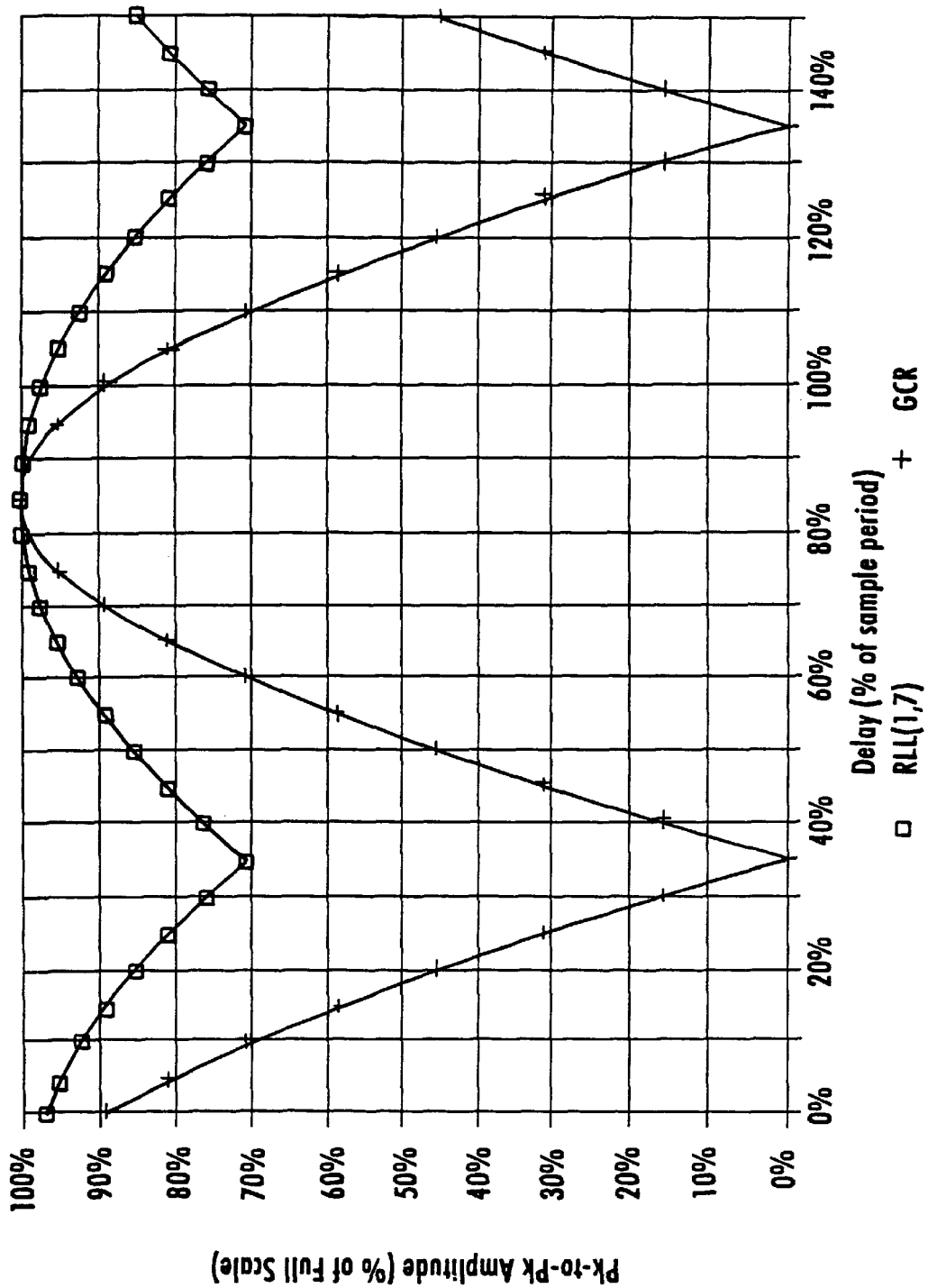
FIG. 9 is a graph of the peak-to-peak amplitude vs. pulse delay for calibrating a variable delay in accordance with a method of the present invention.

In order to calibrate the total delay, which includes the coarse delay and the fine delay in the variable delay 19, a fixed data pattern, at the highest frequency recorded in the desired format (known as Fd) is passed through the read channel, and the PLL 18, 20 is allowed to synchronize to this signal. The coarse delay is adjusted first, followed by the fine adjustment of the delay. Once the coarse delay is adjusted, the fine variable delay 19 is then adjusted through its range, and the output of the peak-to-peak amplitude detector 40 is monitored. This may be done either under operator or microprocessor control. FIG. 9 is an exemplary plot of the peak-to-peak amplitude measured versus total delay for both GCR and RLL (1,7) encoding formats. By selecting the total delay which results in the highest peak-to-peak amplitude, the ideal total delay can be determined.

One problem with this method is that the peak-to-peak amplitude changes very little near the peak of the read pulses, making the peak hard to find. The variable delay can be moved a large distance in each direction to find the delays required to achieve some lower amplitude, then the delay can be set to the middle of these two delay values. The non-linearity of most low cost variable delay circuits, however, results in an error when attempting to find this middle delay value.

The method of calibrating the total delay according to the present invention does not delay the RCLK signal to line up with the peak amplitudes in the $V_{read}$ signal. Instead, only the SCLK signal is delayed so that the data detection circuit 30 samples represent the peak amplitudes. During calibration, after finding the lowest point on the curve shown in FIG. 9 and adjusting the coarse offset and the fine variable delay 19, the value of offset is adjusted up or down by ½ of the value in the programmable frequency divider (4 in the above example), to move the sampling time exactly 180 degrees (50%), corresponding to the highest points of the curve.

The present invention as described above improves data detection by making the determination of a flux transition on the basis of two events rather than one event. If the earliest data sample is s1+n1, and the later data sample is s2+n2, then:

when the amplitude difference between successive positive and negative flux transitions are computed, for instance, if s1+n1=s2+n2>k*(S+S), then a negative transition has occurred.

if $LS = 0$ and $s1 + n1 - s2 + n2 >= +Vt$, positive transition at $s1$ detected.   Eqn. (2)

if $LS = 0$ and $s1 + n1 < s2 + n2$, $s2$ more positive than $s1$, becomes new $s1$
if $LS = 0$ otherwise, no flux transition.
and   Eqn. (3)

if $LS = 1$ and $s1 + n1 - s2 + n2$, $<= -Vt$, negative transition at $s1$ detected.   Eqn. (4)

if $LS = 1$ and $s1 + n1 > s2 + n2$, $s2$ more negative than $s1$, becomes new $s1$
if $LS = 1$ otherwise, No Flux Transition.   Eqn. (5)

For this case, assume Vt is k times the peak-to-peak ideal amplitude, or:

Vt=k*2S then, if LS=0, Prob(0err)=Prob(n1+n2>=k*2S)

if LS=0, Prob(01err)=Prob(n1>=s2+n2)=Prob(n1−n2>+S)

if LS=0, Prob(1err)=Prob(s1+n1−(s2+n2)<k*2S)=Prob(n1−n2<−(1−k)*2S)

and if LS=1, Prob(0err)=Prob(n1+n2<=−k*2S)

if LS=1, Prob(01err)=Prob(n1<=s2+n2)=Prob(n2+n1>=S)

if LS=1, Prob(1err)=Prob(s1+n1−(s2+n2)>−k*2S)=Prob(n1−n2>(1−k)*2S)

Assuming that k=½, then:

$$\text{Prob(err)}=\text{Prob}(|n1\pm n2|>=S)$$

For gaussian noise, the 1-sigma amplitude (N2) of the sum (or difference) of the two samples is:

$$N2=\sqrt{(N^2+N^2)}=\sqrt{(2)}*N$$

Again dividing both sides of the inequality by N2:

$$N2=\sqrt{(2)}*N=\sqrt{(2)}*S/snr$$

$$\text{Prob(err)}=\text{Prob }(|(n1+/-n2)/N2|>\sqrt{(2)}*(½)*snr) \qquad \text{Eqn. (6)}$$

Figure 1:
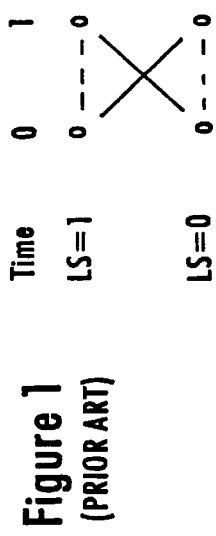
FIG. 1 is a schematic representation of flux levels in magnetic media.
Figure 2:
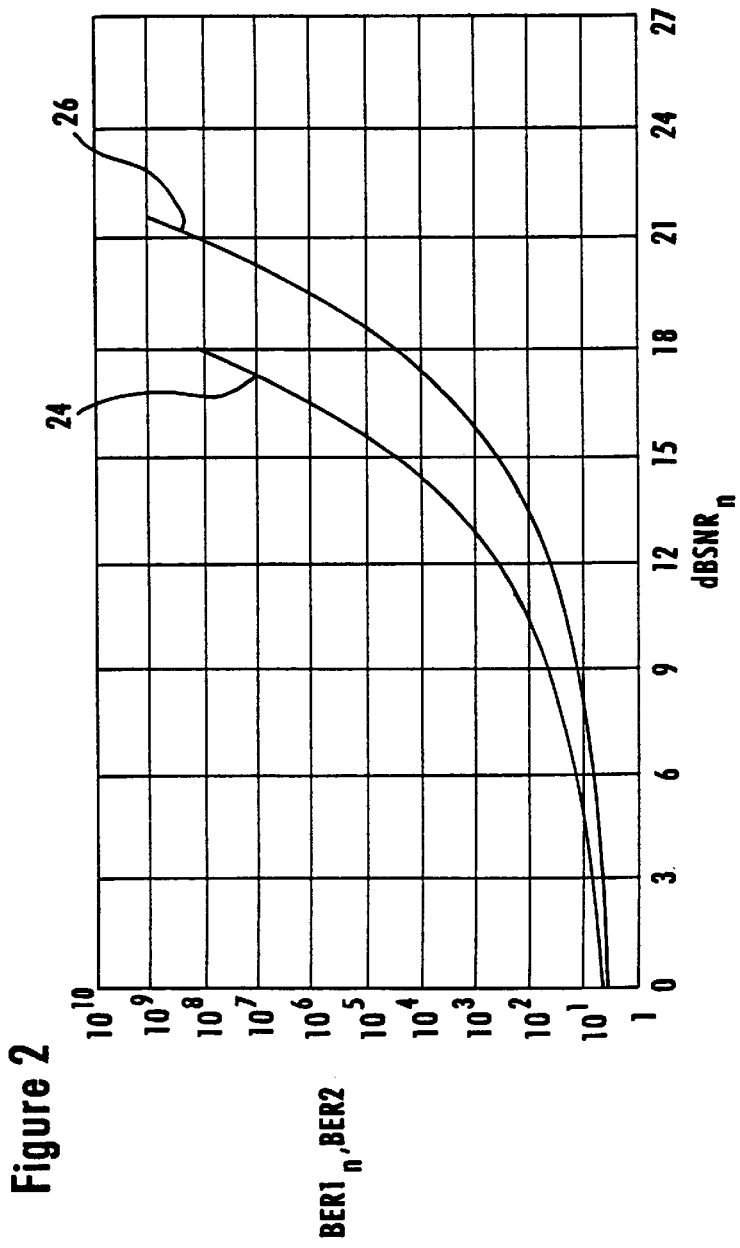
FIG. 2 is a graph comparing the bit error rate vs. signal to noise ratio snr for read channels constructed in accordance with the prior art and for read channels constructed according to the present invention.

It can be seen by comparing equation (6) to equation (1) relating to the standard read channel described earlier that this improves the bit error rate equivalent to an increase of snr by a factor of √(2), or 3 dB. Curve 26 in FIG. 2 is a plot of the bit error rate vs. snr for a read channel that bases the determination of flux transitions on two events according to the present invention. A comparison of curves 24 and 26 graphically demonstrates the significance of the improvement provided by the present invention over the standard read channel. For example, at 18 dB snr, a standard read channel has 1 error in $10^4$ data bits, while the method and apparatus of the read channel of the present invention has 1 error in $10^8$ data bits, better than a thousand-fold improvement.

Although the present invention has been described and illustrated in detail, it is clearly understood that the same is by way of illustration and example only and is not to be taken by way of limitation, the spirit and scope of the present invention being limited only by the terms of the appended claims.

We claim:

1. A method of calibrating a variable delay in a read channel having a peak-to-peak amplitude detector that detects the amplitude of a read signal recovered from a recording medium, and a phase locked loop that generates a read clock signal from the read signal, the method comprising:

inverting the read clock signal;

passing a fixed data pattern through the read channel and synchronizing the phase locked loop to the fixed data pattern;

monitoring an output of the amplitude detector;

adjusting the variable delay so that the amplitude detector detects a minimum amplitude of the read signal; and re-inverting the inverted read clock signal such that the amplitude detector detects a maximum amplitude of the read signal.

2. The method of claim 1, wherein the step of adjusting the variable delay includes offsetting the delay lower and higher than an estimated delay that produces the minimum amplitude of the read signal, measuring the amplitude of the read signal at the lower and higher delays until the measured amplitudes of the read signal at the lower and higher delays are equal, and determining the delay that produces the minimum amplitude as an average of the lower and higher delays.

3. The method of claim 2, further comprising detecting pulses in the read signal and generating a read pulse signal, and wherein the step of synchronizing the phase locked loop includes synchronizing the phase locked loop to a trailing edge of the read pulse signal.

4. The method of claim 3, wherein the step of adjusting includes adjusting a pulse width of the pulses in the read signal to thereby finely adjust a phase delay between the read signal and the read clock signal.

* * * * *